United States Patent [19]

Jones et al.

[11] Patent Number: 5,239,156
[45] Date of Patent: Aug. 24, 1993

[54] APPARATUS AND METHOD FOR LASER JOINING OF SUPERCONDUCTING TAPES

[75] Inventors: Marshall G. Jones, Scotia, N.Y.; Lee E. Rumaner, Seattle, Wash.; Mark G. Benz, Burnt Hills, N.Y.; Bruce A. Knudsen, Amsterdam, N.Y.; Robert J. Zabala, Schenectady, all of N.Y.

[73] Assignee: General Electric Company, Schenectady, N.Y.

[21] Appl. No.: 766,947

[22] Filed: Sep. 27, 1991

[51] Int. Cl.$^5$ ................ B23K 26/00; B23K 1/005
[52] U.S. Cl. ................ 219/121.63; 219/85.13; 219/121.64; 505/925; 505/927
[58] Field of Search ............. 219/121.63, 121.64, 219/85.12, 85.13; 505/925, 927; 29/599, 868, 869, 872, 873; 174/94 R, 125.1

[56] References Cited

U.S. PATENT DOCUMENTS

| | | | |
|---|---|---|---|
| 3,449,818 | 6/1969 | Lowe et al. | 505/925 |
| 4,377,032 | 3/1983 | Benz | 505/927 |
| 5,082,164 | 1/1992 | Rumaner et al. | 505/925 |
| 5,109,593 | 5/1992 | Benz et al. | 29/599 |
| 5,134,040 | 7/1992 | Benz et al. | 505/927 |

FOREIGN PATENT DOCUMENTS

| | | | |
|---|---|---|---|
| 55-50350 | 12/1980 | Japan | 174/94 R |
| 58-110172 | 6/1983 | Japan | 219/121.64 |
| 63-276886 | 11/1988 | Japan . | |
| 1-183177 | 7/1989 | Japan | 29/599 |
| 2-44661 | 2/1990 | Japan . | |
| 2-276180 | 11/1990 | Japan | 505/927 |
| 3-18493 | 1/1991 | Japan | 219/121.64 |
| 3-55781 | 3/1991 | Japan | 29/599 |

*Primary Examiner*—Geoffrey S. Evans
*Attorney, Agent, or Firm*—James R. McDaniel; Paul R. Webb, II

[57] ABSTRACT

Two $Nb_3Sn$ superconducting tapes are overlapped by an amount equal to about two times the width of the superconducting tapes. A filler material of material substantially similar to the tapes is placed between the two tapes in the overlapped region. A NdYAG laser (4) sends a 20-40 watt beam focused by a lens that heats the tapes to create a bridge of superconductivity material formed over the region where the tapes are joined.

5 Claims, 3 Drawing Sheets

APPARATUS AND METHOD FOR LASER JOINING OF SUPERCONDUCTING TAPES

BACKGROUND OF THE INVENTION

1. Field of the Invention

This invention relates to an apparatus and method for laser joining of superconducting tapes. Such structures of this type, generally, allow two separate superconducting ribbon tapes to be joined by a laser melt back such that a bridge of superconducting material is formed over the entire length of the region where the tapes are joined.

2. Description of the Related Art

It is known, in the joining of superconducting tapes, especially tapes constructed of a niobium substrate or core and adjacent outer layers of a triniobium tin alloy or compound to typically employ a soldering iron and a filler to create the superconductive joints between the tapes.

Exemplary of such prior art superconductive tape joining techniques achieving a medium of success in this regard is U.S. Pat. No. 5,109,593, to Benz et al., entitled "Method of Forming a Superconducting Joint Between Superconducting Tapes" and assigned to the same assignee as the present invention. The Benz et al. application discloses the creation of a superconducting joint between separate superconducting tapes through the use of a soldering iron and filler. In particular, the soldering iron heats the materials in the tape and the filler while the tapes are positioned between conventional chill blocks. While this system has met with a degree of commercial success, it is necessarily cumbersome to the operator and relies heavily upon the skill of the operator in order to form a joint which exhibits the desired superconducting characteristics. Therefore, a more advantageous system, then, would be presented if the system could be performed more smoothly while creating a consistent, repeatable superconducting joint.

It is apparent from the above that there exists a need in the art for a superconducting joining system which is capable of forming a superconductive joint more easily through simplicity of parts and uniqueness of structure, but which at the same time creates a superconducting joint that does not adversely affect the superconducting properties of the entire tape after the joint is formed.

SUMMARY OF THE INVENTION

Generally speaking, this invention fulfills these needs by providing an apparatus for laser joining of superconducting tapes, comprising at least two superconducting tapes wherein said tapes substantially overlap for a predetermined distance, a securing means for mechanically securing said tapes substantially along said predetermined distance, a holding means located adjacent said predetermined distance for holding said tapes, a heating means for heating said tapes substantially along said predetermined distance such that a portion of said predetermined distance is melted and solidified to create an electrical circuit substantially across said portion of said predetermined distance and between said tapes, and a traversing means for traversing said tapes such that an electrical circuit is created along the entire predetermined distance.

In certain preferred embodiments, the predetermined distance is approximately equal to twice the width of the tape. Also, the securing means is a solder joint and a filler. Finally, the holding means are transparent glass plates.

In another further preferred embodiment, the melting and subsequent solidification of the tapes create an electric bridge of superconducting material which allows the joined tapes to be substantially superconductive over their entire length including the area where the joint is located.

The preferred superconducting tape joining system, according to this invention, offers the following advantages: easy joint alignment; good stability; good durability; easy joint formation; good economy; excellent superconducting joint characteristics; and high strength for safety. In fact, in many of the preferred embodiments, these factors of joint alignment, joint formation, and joint characteristics are optimized to an extent considerably higher than heretofore achieved in prior, known superconducting joint forming systems.

BRIEF DESCRIPTION OF THE INVENTION

The above and other features of the present invention which will become more apparent as the description proceeds are best understood by considering the following detailed description in conjunction with the accompanying drawings wherein like characters represent like parts throughout the several views and in which.

DETAILED DESCRIPTION OF THE INVENTION

Figure 1:
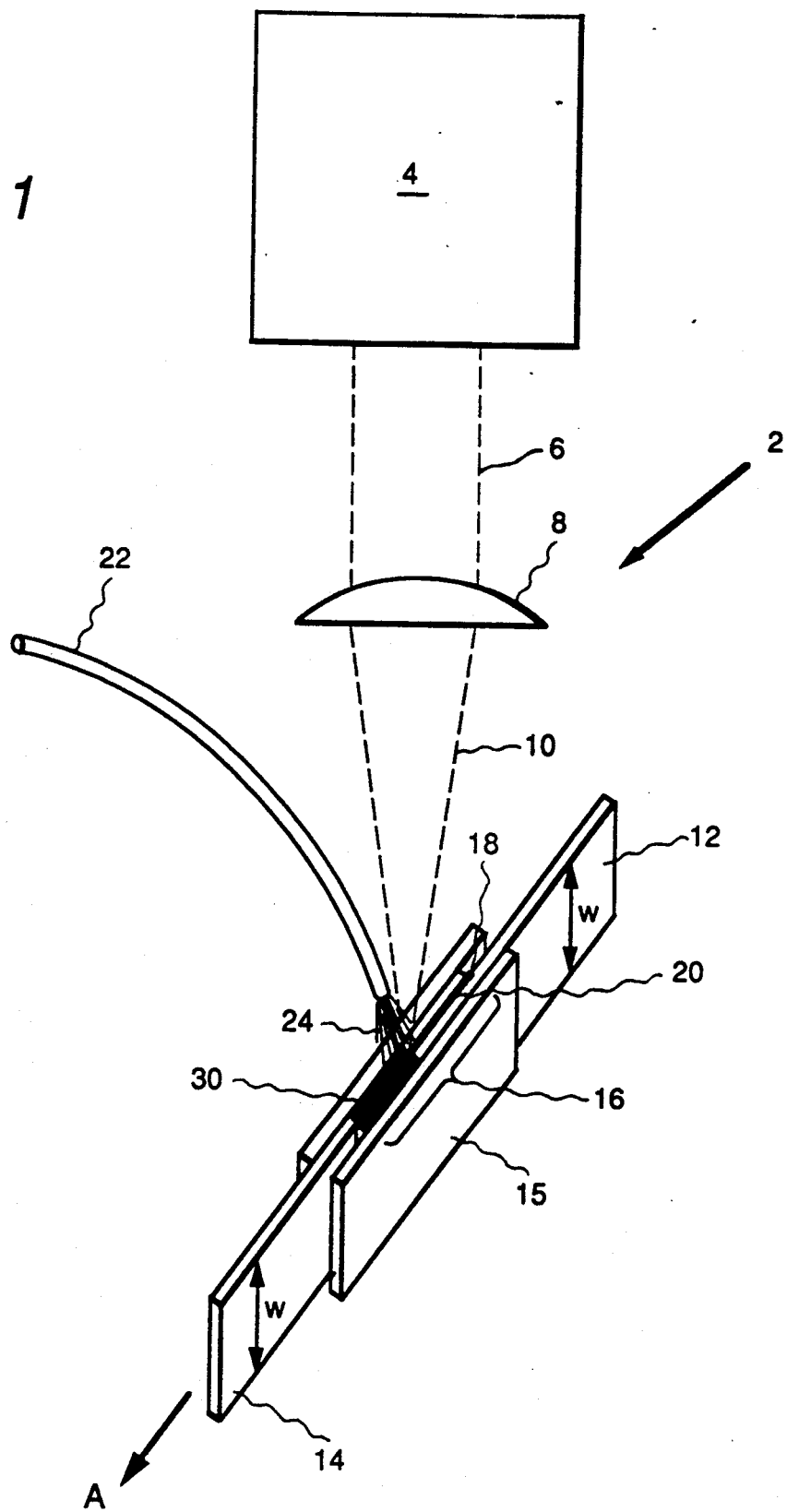
FIG. 1 is a schematic representation of a laser joining apparatus for superconducting tapes, according to the present invention.

With reference first to FIG. 1, there is illustrated apparatus 2 for joining superconducting tapes. Apparatus 2, in part, includes laser 4, having a focused beam 10, tapes 12, 14, transparent plates 15, 17, overlap region 16, filler 18, a conventional solder joint 20, gas source 22 having gas flow 24, and superconducting joint 30. Laser 4, preferably, is a continuous operation neodymium (Nd): yttrium-aluminum-garnet (YAG) source that delivers energy at a 1.06 micrometer wavelength. Tapes 12, 14, preferably, consist of a niobium core ($12b$, $14b$, respectively in FIGS. 2 and 3) with a triniobium tin ($Nb_3Sn$) superconducting alloy layer ($12a$, $12c$ and $14a$, $14c$, respectively). Plates 15 and 17, preferably, are glass slides. Region 16, preferably, is such that its length is at least approximately equal to twice the width (w) of tapes 12, 14. Filler 18, preferably, is constructed of the same or substantially similar material as layers $12a$, $12c$, $14a$ and $14c$. Gas source 22, preferably, provides an argon gas flow 24 to the area where focused laser beam 10 contacts region 16. Argon gas is used in order to reduce the likelihood of oxides forming in joint 30.

Figure 2:
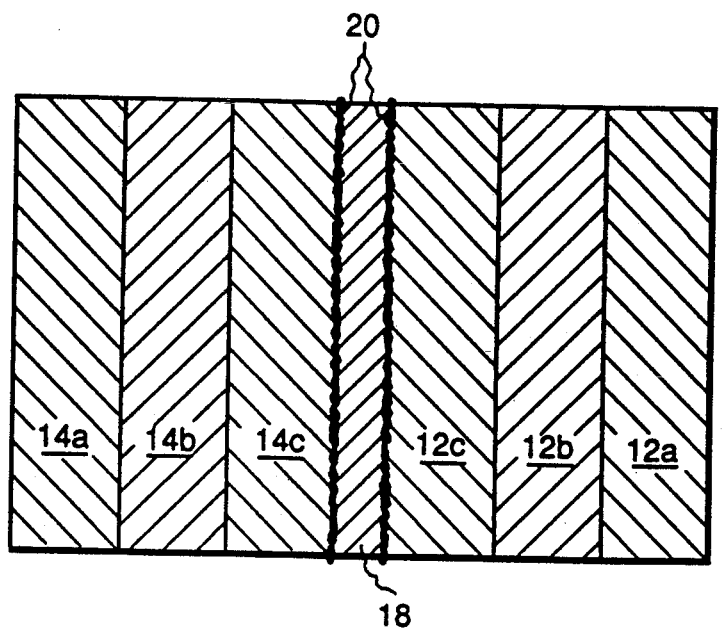
FIG. 2 is an end view of two superconducting tapes secured together by a solder joint prior to being laser treated.

In order to form joint 30, tapes 12, 14 are overlapped such that region 16 is approximately equal to twice the width (w) of tapes 12, 14. Filler 18 is then placed by conventional techniques between the sides of tapes 12, 14 where tapes 12, 14 contact over region 16 (FIG. 2). Tapes 12, 14 are soldered together with solder joints 20 by conventional soldering techniques to mechanically secure tapes 12, 14 together with filler. Plates 15, 17 are then placed over region 16 which has been soldered together and held in place over region 16 by a conventional holding device (not shown). At this point, region 16 is ready to be laser treated.

In operation, laser 4 creates a laser beam which, preferably, is a 20-40 watt beam. Beam 6 is then focused by lens 8 to create focused laser beam 10. Lens 8, preferably, is a conventional 50 mm focal length lens. Gas source 22 is activated such that gas flow 24 moves across region 16. Focused beam 10 impinges upon a small portion of region 16 which causes filler 18, layers 12a, 12b, 12c and 14a, 14b, 14c to begin to melt and flow such that a bead 40 (FIG. 3) of superconducting material forms across the portion of region 16 which was heated. Bead 40 provides the adequate superconducting electrical circuit so that the electrical current can be carried, for example, along layers 12a, 12c to layers 14a, 14c. While a portion of region 16 is being laser heat treated, tapes 12, 14 are traversed along the direction of arrow A by a conventional tape moving device (not shown) until the entire region 16 is covered with bead 40. Preferably, tapes 12, 14 move along the direction of arrow A at a speed of approximately 18 inches/minute. It is to be understood that speed is a function of the power density delivered to the joint. Also, bead 40 should be created on both edges of region 16.

Figure 3:
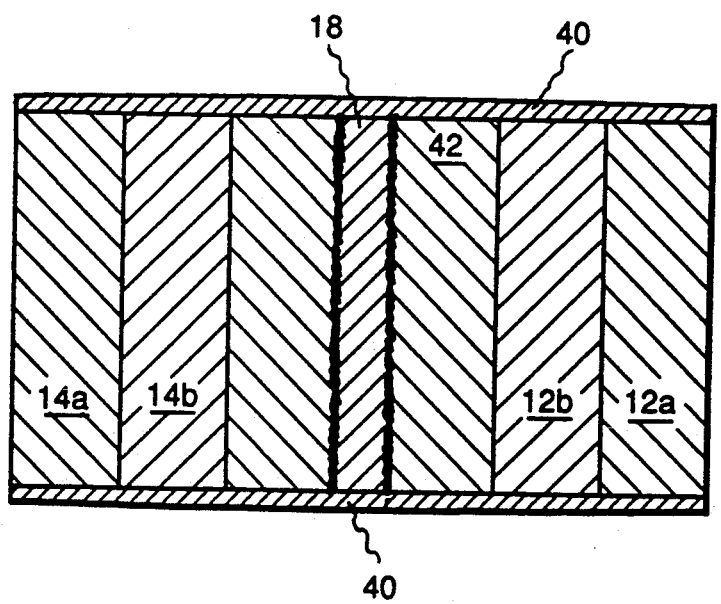
FIG. 3 is an end view of two superconducting tapes after being laser treated.

With respect to FIG. 3, filler 18 is illustrated as well as bead 40. Bead 40 is now a combination layer of layers 12c and 14c, filler 18 and solder joint 20.

Figure 4:
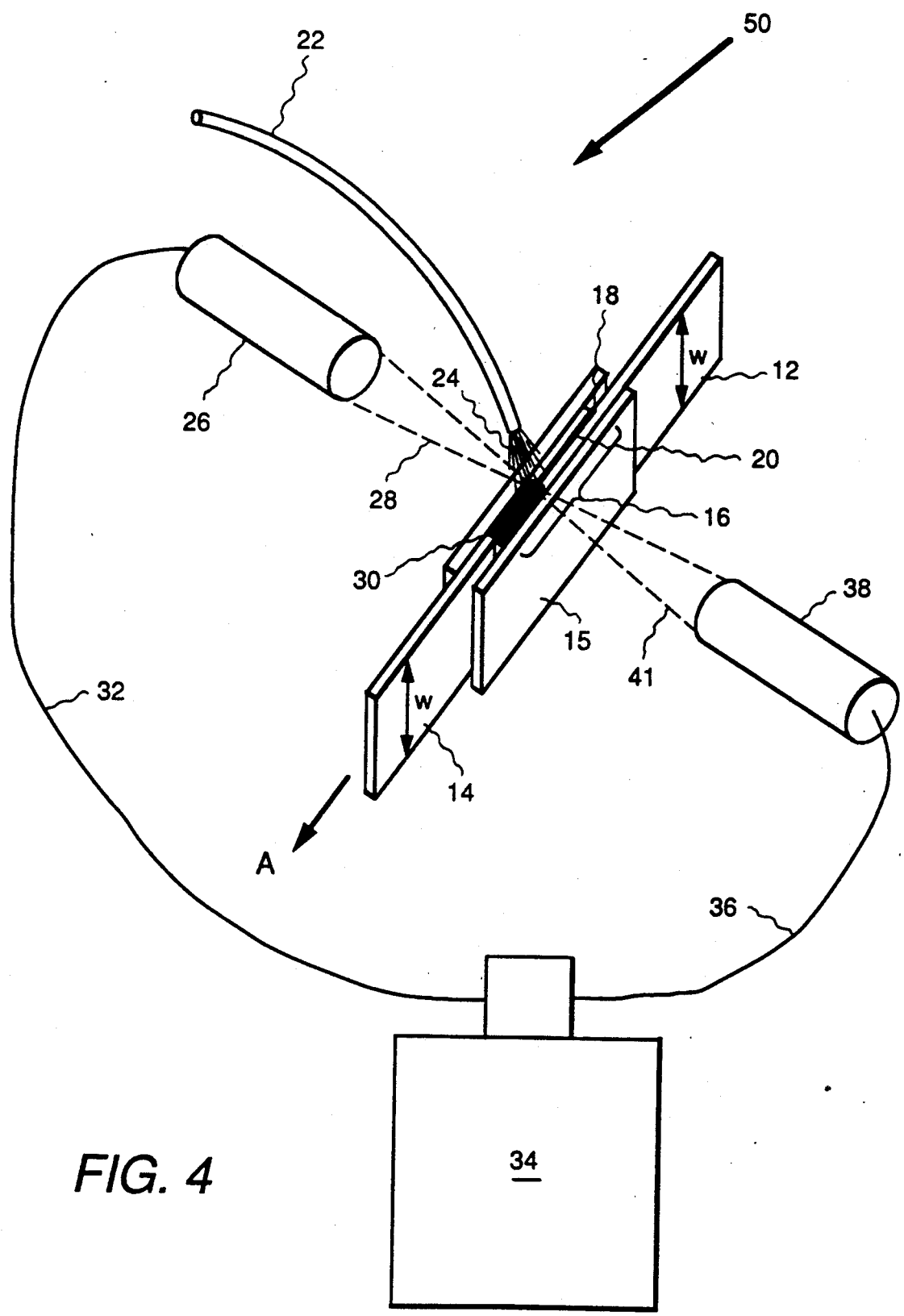
FIG. 4 is a schematic representation of another embodiment of a laser joining apparatus for superconducting tapes, according to the present invention.

FIG. 4 represents a schematic illustration of another embodiment of the present invention. Apparatus 50 includes the same elements as apparatus 2 except laser 4, beams 6 and 10 and lens 8. Thus the corresponding elements between apparatus 2 and 50 are numbered the same. Apparatus 50 further includes conventional laser output couplers 26 and 38 emitting focused laser beams 28 and 41, respectively. Conventional fiber optic lines 32 and 36 are connected to couplers 26 and 38, respectively. Lines 32 and 36 are also connected to a conventional laser 34. Laser 34, preferably, is constructed the same as laser 4 (FIG. 1). Couplers 26 and 38, preferably, are designed to be able to focus a 20-40 watt laser beam on region 16. It is to be understood that output couplers 26, 38 can be angled so that laser focused beams 28 and 41, respectively, impinge upon a small portion of region 16.

The operation of apparatus 50 is very similar to the operation of apparatus 2 except for the use of focused laser beams 28 and 41. In particular, focused beams 28 and 41 impinge upon a small portion of region 16 in order to form bead 40. Tapes 12, 14 are traversed along the direction of arrow A in the same manner as they were with respect to apparatus 2.

Once given the above disclosure, many other features, modifications or improvements will become apparent to the skilled artisan. Such features, modifications or improvements are, therefore, considered to be apart of this invention, the scope of which is to be determined by the following claims.

What is claimed is:

1. An apparatus for automating a laser joining of superconducting tapes, comprising:
    a securing means for mechanically securing at least two superconducting tapes which are substantially overlapped for a predetermined distance such that said predetermined distance is about equal to two times a width of at least one of said tapes; and said securing means further comprises, a filler means and a solder joint;
    a substantially transparent holding means located adjacent to said tapes for holding said tapes;
    a laser heating means for heating said tapes such that said heating means heats said tapes in an automated manner substantially along said predetermined distance such that a portion of said predetermined distance is melted and solidified to create at least two automated joints substantially across said portion of said predetermined distance and between said tapes; and
    a traversing means for traversing said tapes relative to said heating means such that an electrical circuit is created by said automated joints along the entire predetermined distance in one pass of said heating means.

2. The apparatus, according to claim 1, wherein said filler means is further comprised of:
    superconducting material which is comprised of a material that is substantially similar to a superconducting material contained in said tapes.

3. The apparatus, according to claim 1, wherein said superconducting tapes are further comprised of:
    triniobium tin.

4. A method for automated laser joining of superconducting tapes including at least two superconducting tapes, a securing means including a filler means and a solder joint, a transparent holding means, a laser heating means and a traversing means, said method comprised of the steps of:
    overlapping said tapes a predetermined distance such that said predetermined distance is about equal to two times a width of at least one of said tapes;
    securing said tapes substantially along said predetermined distance with said filler means and said solder joint;
    heating said tapes substantially along said predetermined distance in an automated manner with said laser heating means such that a portion of said predetermined distance is melted and solidified to create at least two automated joints substantially across said portion of said predetermined distance and between said tapes; and
    operating said traversing means such that an electrical circuit is created by said automated joints along the entire predetermined distance in one pass of said heating means.

5. The method, as in claim 4, wherein said superconducting tapes are further comprised of:
    triniobium tin.

* * * * *